(12) United States Patent
Feng et al.

(10) Patent No.: US 8,745,551 B2
(45) Date of Patent: Jun. 3, 2014

(54) PATTERN-INDEPENDENT AND HYBRID MATCHING/TUNING INCLUDING LIGHT MANIPULATION BY PROJECTION OPTICS

(75) Inventors: Hanying Feng, Fremont, CA (US); Yu Cao, Saratoga, CA (US); Jun Ye, Palo Alto, CA (US)

(73) Assignee: ASML Netherlands B.V., Veldhoven (NL)

( * ) Notice: Subject to any disclaimer, the term of this patent is extended or adjusted under 35 U.S.C. 154(b) by 107 days.

(21) Appl. No.: 13/293,118

(22) Filed: Nov. 9, 2011

(65) Prior Publication Data

US 2012/0124529 A1 May 17, 2012

Related U.S. Application Data

(60) Provisional application No. 61/414,787, filed on Nov. 17, 2010.

(51) Int. Cl.
*G06F 17/50* (2006.01)

(52) U.S. Cl.
USPC .................. 716/54; 716/50; 716/51; 716/132

(58) Field of Classification Search
USPC ............................................................ 716/54
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,969,441 A | 10/1999 | Loopstra et al. | |
| 6,046,792 A | 4/2000 | Van Der Werf et al. | |
| 7,003,758 B2 | 2/2006 | Ye et al. | |
| 7,587,704 B2 | 9/2009 | Ye et al. | |
| 2008/0174756 A1* | 7/2008 | Granik ............................ 355/67 |
| 2009/0157360 A1 | 6/2009 | Ye et al. | |
| 2010/0122225 A1 | 5/2010 | Cao et al. | |
| 2010/0146475 A1 | 6/2010 | Cao et al. | |

FOREIGN PATENT DOCUMENTS

WO  2010/059954  5/2010

OTHER PUBLICATIONS

Chris Spence, "Full-Chip Lithography Simulation and Design Analysis—How OPC is Changing IC Design," Proc. SPIE, vol. 5751, pp. 1-14 (2005).
Y. Cao et al., "Optimized Hardware and Software for Fast, Full Chip Simulation," Proc. SPIE, vol. 5754, pp. 407-414 (2005).
Alan E. Rosenbluth et al., "Optimum Mask and Source Patterns to Print a Given Shape," Journal of Microlithography, Microfabrication, Microsystems, vol. 1, No. 1, pp. 13-20 (Apr. 2002).
Yuri Granik, "Source Optimization for Image Fidelity and Throughput," Journal of Microlithography, Microfabrication, Microsystems, vol. 3, No. 4, pp. 509-522 (Oct. 2004).
Robert Socha et al., "Simultaneous Source Mask Optimization (SMO)," Proc. of SPIE, vol. 5853, pp. 180-193 (2005).

* cited by examiner

*Primary Examiner* — Jack Chiang
*Assistant Examiner* — Eric Lee
(74) *Attorney, Agent, or Firm* — Pillsbury Winthrop Shaw Pittman LLP

(57) ABSTRACT

Described herein are methods for matching the characteristics of a lithographic projection apparatus to a reference lithographic projection apparatus, where the matching includes optimizing illumination source and projection optics characteristics. The projection optics can be used to shape wavefront in the lithographic projection apparatus. According to the embodiments herein, the methods can be accelerated by using linear fitting algorithm or using Taylor series expansion using partial derivatives of transmission cross coefficients (TCCs).

20 Claims, 10 Drawing Sheets

PATTERN-INDEPENDENT AND HYBRID MATCHING/TUNING INCLUDING LIGHT MANIPULATION BY PROJECTION OPTICS

CROSS-REFERENCE TO RELATED APPLICATIONS

This application claims priority to U.S. Provisional Application No. 61/414,787, filed Nov. 17, 2010, the contents of which are incorporated by reference herein in its entirety.

FIELD OF THE INVENTION

The claimed invention relates to lithographic apparatuses and processes, and more particularly to tools for optimizing illumination sources, and projection optics for use in lithographic apparatuses and processes.

BACKGROUND OF THE INVENTION

A lithographic projection apparatus can be used, for example, in the manufacture of integrated circuits (ICs). In such a case, a mask may contain a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the mask. In general, a single substrate contains a plurality of adjacent target portions to which the circuit pattern is transferred successively by the lithographic projection apparatus, one target portion at a time. In one type of lithographic projection apparatuses, the circuit pattern on the entire mask is transferred onto one target portion in one go; such an apparatus is commonly referred to as a wafer stepper. In an alternative apparatus, commonly referred to as a step-and-scan apparatus, a projection beam scans over the mask in a given reference direction (the "scanning" direction) while synchronously moving the substrate parallel or anti-parallel to this reference direction. Different portions of the circuit pattern on the mask are transferred to one target portion progressively. Since, in general, the lithographic projection apparatus will have a magnification factor M (generally <1), the speed F at which the substrate is moved will be a factor M times that at which the projection beam scans the mask. More information with regard to lithographic devices as described herein can be gleaned, for example, from U.S. Pat. No. 6,046,792, incorporated herein by reference.

Prior to transferring the circuit pattern from the mask to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, will have to be repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the light from the illumination source.

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the lithographic projection apparatus as well as to the design layout. These include, for example, but not limited to, optimization of NA and optical coherence settings, customized illumination schemes, use of phase shifting masks, optical proximity correction (OPC, sometimes also referred to as "optical and process correction") in the design layout, or other methods generally defined as "resolution enhancement techniques" (RET).

As one important example, OPC addresses the fact that the final size and placement of an image of the design layout projected on the substrate will not be identical to, or simply depend only on the size and placement of the design layout on the mask. It is noted that the terms "mask" and "reticle" are utilized interchangeably herein. Also, person skilled in the art will recognize that, especially in the context of lithography simulation/optimization, the term "mask" and "design layout" can be used interchangeably, as in lithography simulation/optimization, a physical mask is not necessarily used but a design layout can be used to represent a physical mask. For the small feature sizes and high feature densities present on some design layout, the position of a particular edge of a given feature will be influenced to a certain extent by the presence or absence of other adjacent features. These proximity effects arise from minute amounts of light coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—

How OPC Is Changing IC Design", C. Spence, Proc. SPIE, Vol. 5751, pp 1-14 (2005) provides an overview of current "model-based" optical proximity correction processes. In a typical high-end design almost every feature of the design layout requires some modification in order to achieve high fidelity of the projected image to the target design. These modifications may include shifting or biasing of edge positions or line widths as well as application of "assist" features that are intended to assist projection of other features.

Application of model-based OPC to a target design requires good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the manufacturing of a mask. This is driven by the enormous cost of making high-end masks, which run in the multi-million dollar range, as well as by the impact on turn-around time by reworking or repairing actual masks once they have been manufactured.

Both OPC and full-chip RET verification may be based on numerical modeling systems and methods as described, for example in, U.S. Pat. No. 7,003,758 and an article titled "Optimized Hardware and Software For Fast, Full Chip Simulation", by Y. Cao et al., Proc. SPIE, Vol. 5754, 405 (2005).

In addition to optimization to design layouts or masks (e.g., OPC), the illumination source can also optimized, either jointly with mask optimization or separately, in an effort to improve the overall lithography fidelity. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the mask. However, when compared to a traditional illumination source, an off-axis illumination source usually provides less light intensity for the aerial image (AI). Thus, it becomes necessary to attempt to optimize the illumination source to achieve the optimal balance between finer resolution and reduced light intensity. The terms "illumination source" and "source" are used interchangeably in this document.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik's method, which dictates the trade-off between optimizing the source for wafer image fidelity and the smoothness requirement of the source.

For low $k_1$ photolithography, optimization of both the source and mask is very useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and mask diffraction orders. The term "design variables" as used herein means a set of parameters of a lithographic projection apparatus, for example, parameters a user of the lithographic projection apparatus can adjust. It should be appreciated that any characteristics of a lithographic projection apparatus, including those of the source, the mask, the projection optics, can be among the design variables in the optimization. The cost function is often a non-linear function of the design variables. Then standard optimization techniques are used to minimize the cost function.

One problem with these algorithms that formulate a cost function is that they require a large number of full forward optical imaging model simulations before convergence on both optimal source and mask is reached. Optimizing the lithographic projection apparatus using a clip (which is defined as a portion of a design layout with calibration features that can be used for optimization of the lithographic projection apparatus, as elaborated further in the detailed description section) of medium complexity can take weeks or even months on latest standard PC hardware, which is generally considered impractical. A practical optimization process generally costs less than about 24 hours.

Relatedly, the delay of EUV lithography and the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. The 1.35 ArF hyper numerical apertures (NA) exposure tool will be the exposure tool for chip manufactures to use in the next two years. To ensure that circuit design can be produced on to the substrate with workable process window; source-mask optimization (SMO) is becoming an important RET that is required for 2× nm node.

A source and mask (design layout) optimization method and system that allow for simultaneous optimization of the source and mask using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

New development in hardware and software of lithographic projection apparatuses provides more flexibility by making projection optics therein adjustable. The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics can include optical components for shaping, adjusting and/or projecting light from the source before the light passes the mask, and/or optical components for shaping, adjusting and/or projecting the light after the light passes the mask. The projection optics generally exclude the source and the mask.

For example, adjustable parameters ("knobs") of the projection optics make it possible to shape light in more degrees of freedom (e.g., wavefront shape, intensity distribution, etc.) and/or to accommodate a wider range of conditions of the source and the mask (namely to provide a larger process window (PW)), than what is offered by the existing SMO techniques.

However, optimizing these additional knobs entails very high computation cost. Therefore, methods to simplify and accelerate optimization of these knobs related to the projection optics jointly with knobs associated with the source and mask are desirable.

Therefore what is needed is a computationally-efficient comprehensive optimization method for characterizing a lithographic process based on which the setting of a lithographic apparatus (including setting of a projection optics system) is decided and a mask is designed.

An additional benefit of having more adjustable parameters to pre-optimize a lithographic projection apparatus is that it enables a user to tune the behavior of one lithographic projection apparatus in order to match the behavior of another reference lithographic projection apparatus or a desired preset scanner behavior based on a simulation model (e.g., the behavior of a virtual scanner). Note that the term "scanner" is used broadly in this application to describe scanning-type or any other type of lithographic projection apparatus. In copending co-owned patent application, titled, "Methods and System for Model-Based Generic Matching and Tuning," US publication no. 2010/0146475 to Cao et al., behavior matching/tuning has been discussed, but the adjustment parameters ("knobs") were mainly linear parameters, such as illumination source intensity parameters.

What is needed is a more comprehensive behavior matching/tuning methodology that integrates non-linear multi-variable optimization involving characteristics of illumination source and projection optics.

BRIEF SUMMARY OF THE INVENTION

Embodiments as described herein provide methods for improving/optimizing a lithographic projection apparatus including improving/optimizing projection optics therein, and preferably including the capability of optimizing a source, a mask, and the projection optics, simultaneously or alternatively. Properties of the light propagating towards the substrate can be manipulated by adjustable components of the projection optics and/or the source using a combination of hardware and software control. The projection optics is sometimes referred to as "lens", and therefore the optimization process may be termed "source mask lens optimization" (SMLO). Another term used to describe the SMLO process is "source mask pupil optimization" (SMPO), as in certain embodiments, lens optimization is done for the pupil plane of the projection optics. However, the scope of the invention is not restricted to optimization in the pupil plane only. SMLO is desirable over existing source mask optimization process (SMO) or other optimization processes that does not explicitly include the optimization of projection optics, partially because including the projection optics in the optimization can lead to a larger process window by introducing a plurality of adjustable characteristics of the projection optics. The projection optics can be used to shape wavefront in the lithographic projection apparatus to, for example, adjust aberrations in the lithographic imaging process. According to the embodiments herein, the optimization can be accelerated by numerical techniques. Although adjustable characteristics of the projection optics and/or the source are used in the description of the embodiments, other adjustable characteristics of the lithographic projection apparatus, such as, dose and focus, can be adjusted in the optimization.

The embodiments herein optimize the lithographic projection apparatus by minimizing a suitable cost function of design variables that can be characteristics of the source, projection optics, and the mask/design layout. Usually, when the optimization is a part of a matching/tuning methodology, then the design variables of the mask/design layout are kept fixed, while the design variables of the source and the projection optics are tuned. Non-limiting examples of the cost function are given, including cost functions that represent a difference in lithographic response between a current lithographic process and a reference lithographic process. Other forms of the cost function are also possible and can accommodate a wide variety of lithography metrics. The cost function can be a function of the design variables of the to-be-tuned lithography process. Non-linear effects of projection optics is built-into the cost function by choosing appropriate design variables.

The optimization process gives additional flexibility in terms of matching/tuning the behavior of the lithographic projection apparatus to a physical reference scanner's behavior or a desired preset behavior of a virtual reference scanner. In the subsequent description, the generic terms "scanner-T" and "scanner-R" are used to broadly describe a to-be-tuned lithographic projection apparatus, and a reference lithographic projection apparatus (physical or virtual), respectively.

In previous approaches, the adjustment parameters ("knobs") used for matching/tuning were mainly linear parameters, such as illumination source intensity parameters. In order to handle non-linear effects such as the effect of projection optics in shaping the imaging light and non-linear effects on lithographic responses (such as, CD, EPE etc.) which can not be taken into account in previous linear optimization approaches, additional non-linear adjustment parameters are included in the matching/tuning methodology in the embodiments of the present invention.

Behavior matching can be useful for correcting behavior differences between two lithographic projection apparatuses due to variations of manufacturing these apparatuses, or correcting deviation of behaviors of one lithographic projection apparatus over time due to factors such as temperatures, wear, aging, chemical and physical properties of resist, mask, etc. In the simulation domain, the behavior of the reference lithographic projection apparatus may be available a priori as a simulated reference model, i.e. the simulated reference model represents the behavior of a virtual scanner. When comparing behavior with a physical scanner, the same type of scanner (i.e. same model of scanner) or a different type of scanner (i.e. a different model of scanner) may be used as the reference. When a virtual scanner's behavior is used as simulated reference model, the simulated reference model may be based on a customized behavior that an end-user wants, or an 'ideal' or desired behavior that produces a predefined process window or produces favorable lithographic responses. For example, a particular behavior of an apparatus may be modeled as a relationship between a design layout to an image or a resist image on a reference substrate generated by projecting the design layout onto the substrate using the lithographic projection apparatus. The resist image can be represented by, for example, various characteristics of the resist image (e.g., resist contours, CD, edge placement error). The behaviors of a lithographic projection apparatus can be, for example, combined optical behaviors of the source and the projection optics, which is independent from the design layout. If two lithographic projection apparatuses have identical combined optical behaviors of the source and the projection optics, images projected from an identical design layout to an identical resist-coated substrate by these two lithographic projection apparatuses will be substantially identical. The combined optical behaviors of the source and the projection optics of a lithographic projection apparatus can be represented by the transmission cross coefficient (TCC) as explained in details below. Therefore, matching behaviors of a lithographic projection apparatus to the desired behaviors can be achieved by matching the TCC of the lithographic projection apparatus to the TCC representing the desired behaviors. The cost function is flexible enough to be adapted to all the various possibilities of behavior matching/tuning mentioned above.

Furthermore, the behavior matching/tuning may be done in a pattern-independent manner such as the TCC matching, or in a hybrid manner in which in addition to TCC matching, the matching/tuning further comprises comparing a lithographic response using a test pattern (or multiple test patterns).

Persons skilled in the art will appreciate that though "matching" and "tuning" are used here interchangeably, typically "matching" indicates behavior matching between two physical scanners, and "tuning" indicates adjusting a simulation model of a scanner with respect to a reference simulation model. The reference simulation model may come from a physical scanner, but it does not have to. The matching/tuning can be done with process window constraints. For example, in tuning, a process can be adapted to remain within a predefined process window. However, matching/tuning can be done without process window constraint also.

BRIEF DESCRIPTION OF THE DRAWINGS

The above aspects and other aspects and features of the present invention will become apparent to those ordinarily skilled in the art upon review of the following description of specific embodiments in conjunction with the accompanying figures, wherein.

DETAILED DESCRIPTION

Figure 1:
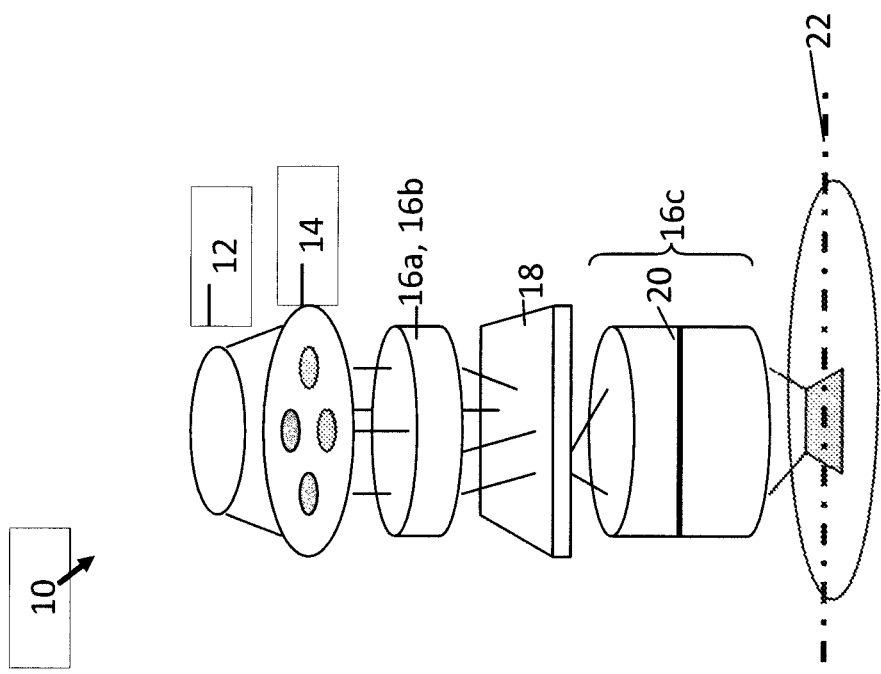
FIG. 1 is a block diagram of various subsystems of a lithographic projection apparatus.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The mask referred to above comprise design layouts. The design layouts can be generated utilizing CAD (computer-aided design) programs, this process often being referred to as EDA (electronic design automation). Most CAD programs follow a set of predetermined design rules in order to create functional design layouts/masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the mask).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10. Major components are an illumination source 12, which may be a deep-ultraviolet excimer laser source or other type of sources including extreme ultra violet (EUV) sources, illumination optics which define the partial coherence (denoted as sigma) and which may include optics 14, 16a and 16b that shape light from the source 12; a mask or reticle 18; and transmission optics 16c that project an image of the reticle pattern onto a substrate plane 22. An adjustable filter or aperture 20 at the pupil plane of the projection optics may restrict the range of beam angles that impinge on the substrate plane 22, where the largest possible angle defines the numerical aperture of the projection optics $NA=\sin(\Theta_{max})$.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (at evaluation points) of the system with respect to the intended values (e.g., ideal values) of these characteristics; the cost function can also be the maximum of these deviations. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or mask manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination through a mask and onto a substrate. The term "projection optics" is broadly defined here to include any optical component that may alter the wavefront of the radiation beam. For example, projection optics may include at least some of the components 14, 16a, 16b and 16c. An aerial image (AI) is the light intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. Patent Application Publ. No. 2009/0157360, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the mask and the projection optics) dictate the aerial image. Since the mask used in the lithographic projection apparatus can be changed, it is desirable to separate the optical properties of the mask from the optical properties of the rest of the lithographic projection apparatus including at least the source and the projection optics.

Figure 2:
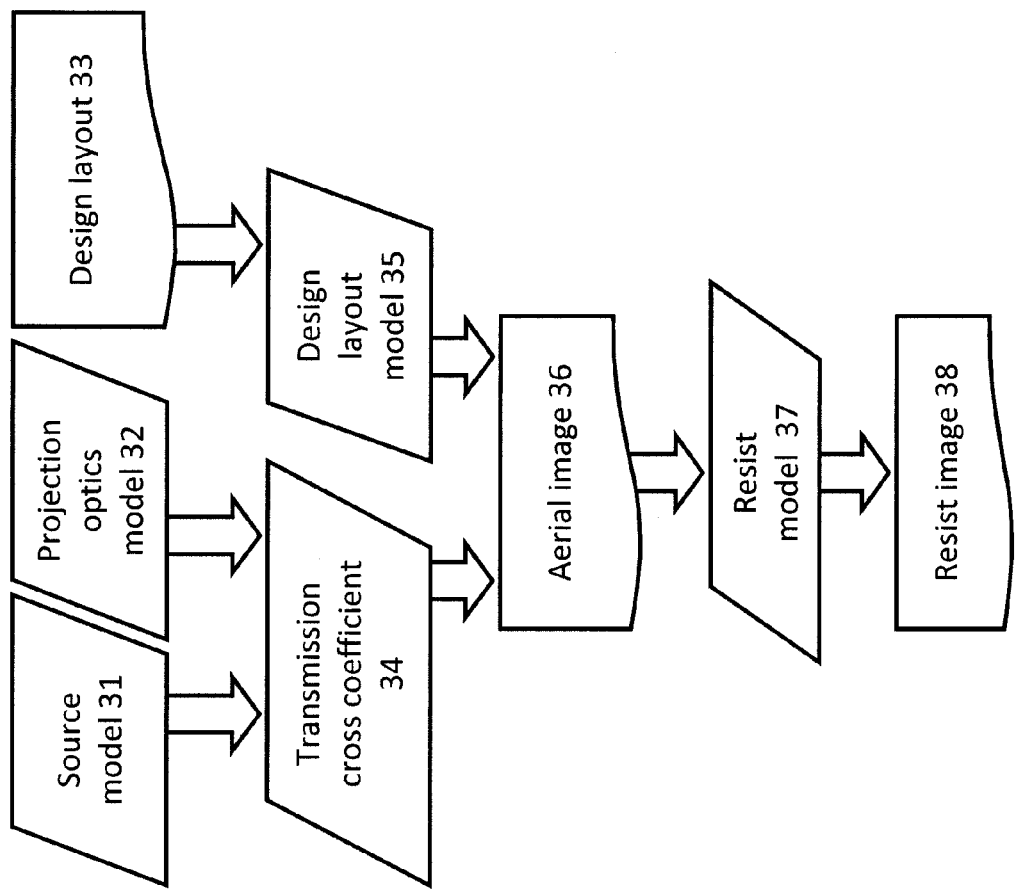
FIG. 2 is a block diagram of simulation models corresponding to the subsystems in FIG. 1.

An exemplary flow chart for simulating lithography in a lithographic projection apparatus is illustrated in FIG. 2. A source model 31 represents optical characteristics (including light intensity distribution and/or phase distribution) of the source. A projection optics model 32 represents optical characteristics (including changes to the light intensity distribution and/or the phase distribution caused by the projection optics) of the projection optics. The source model 31 and the projection optics model 32 can be combined, as explained later herein, into a transmission cross coefficient (TCC) model 34. A design layout model 35 represents optical characteristics (including changes to the light intensity distribution and/or the phase distribution caused by a given design layout 33) of a design layout 33, which is the representation of an arrangement of features on a mask. An aerial image 36 can be simulated from the transmission cross coefficient 34 and the design layout model 35. A resist image 37 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma ($\sigma$) settings as well as any particular illumination source shape (e.g. off-axis light sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical mask, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In a specific embodiment of the invention, a full set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout where critical features are identified either by experience (including clips provided by a customer), by trial and error, or by running a full-chip simulation. Clips usually contain one or more test patterns or gauges.

An initial larger set of clips may be provided a priori by a customer based on known critical feature areas in a design layout which require particular image optimization. Alternatively, in another embodiment of the present invention, the initial larger set of clips may be extracted from the entire design layout by using some kind of automated (such as, machine vision) or manual algorithm that identifies the critical feature areas.

To reduce the overall computation burden, various ways of optimization can be envisioned. In one embodiment, first a set of clips is selected by a pattern selection method based on diffraction signature analysis or any other method, and then the SMLO process is performed. Alternatively, first a full chip simulation is performed, 'hot spots' and/or 'warm spots' are identified from the full chip simulation, and then a pattern selection step is performed. The optimization is done based on the selected patterns. The pattern selection algorithm (based on diffraction signature analysis or other methods) can be seamlessly integrated with the SMLO process. One example method is described further with respect to FIG. 7.

Figure 3:
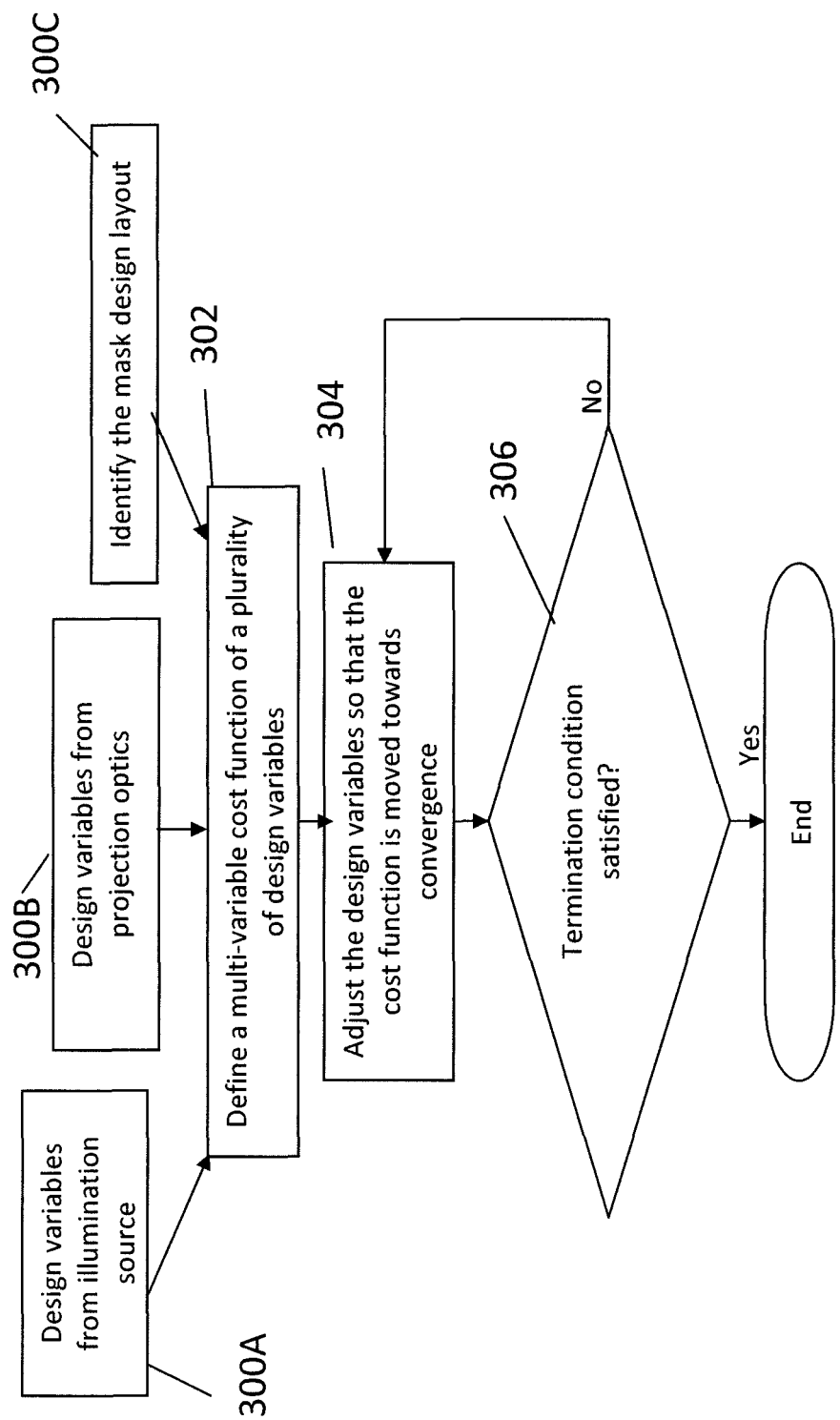
FIG. 3 is a flow diagram illustrating aspects of an example methodology of cost function optimization according to embodiments.

A general method of optimizing the lithography projection apparatus using SMLO, according to an embodiment, is illustrated in FIG. 3. This method comprises a step 302 of defining a multi-variable cost function of a plurality of design variables. At least some of the design variables are characteristics of the projection optics, as shown in step 300B. Other design variables may be associated with illumination source (step 300A) and the design layout (step 300C), although in matching/tuning methodologies discussed herein, usually the design layout is kept fixed, i.e. the design variables represent the illumination source and the projection optics, while the characteristics of the design layout take fixed values. In step 304, the design variables are adjusted so that the cost function is moved towards convergence. In step 306, it is determined whether a predefined termination condition is satisfied. The predetermined termination condition may include various possibilities, i.e. the cost function may be minimized or maximized, as required by the numerical technique used, the value of the cost function becomes equal to a threshold value or crosses the threshold value, the value of the cost function reaches within a preset error limit, a predefined computation time elapses, or a preset number of iterations is reached. If either of the conditions in step 306 is satisfied, the method ends. If none of the conditions in step 306 is satisfied, the step 304 and 306 are repeated until a desired result is obtained.

In a lithographic projection apparatus, the source, mask and projection optics can be optimized alternatively (referred to as "Alternative Optimization") or optimized simultaneously (referred to as "Simultaneous Optimization", or "Co-optimization"), according to embodiments. The terms "simultaneous", "simultaneously", "joint" and "jointly" as used herein mean that the design variables of the characteristics of the source, mask, projection optics and/or any other design variables, are allowed to change at the same time. The term "alternative" and "alternatively" as used herein mean that not all of the design variables are allowed to change at the same time. In FIG. 3, step 304 may indicate simultaneous optimization, or alternative optimization.

In co-pending co-owned provisional application U.S. No. 61/472,372, titled, "Optimization of Source, Mask, and Projection Optics," filed on Nov. 10, 2010, details of various optimization techniques are elaborated including the detailed mathematical framework. The entire application 61/472,372 is incorporated by reference herein. The present application emphasizes on how a behavior matching between a to-be-tuned lithographic projection apparatus model and a reference lithographic projection apparatus model seamlessly integrates the SMLO process.

The following section describes the mathematical definition of cost function only in general terms, as a non-limiting example.

In a lithographic projection apparatus, a cost function can be expressed as $$CF(z_1, z_2, \ldots, z_N) = \sum_{p=1}^{P} w_p f_p^2(z_1, z_2, \ldots, z_N) \quad (\text{Eq. 1})$$

wherein $(z_1, z_2, \ldots, z_N)$ are N design variables or values thereof; $f_p(z_1, z_2, \ldots, z_N)$ is a difference between an actual value and an intended value of a characteristic at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the wafer, or any point on a virtual design layout, or resist image, or aerial image. The cost function may represent any suitable characteristics of the lithographic projection apparatus or the substrate, for instance, focus, CD, image shift, image distortion, image rotation, etc. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The cost function may also represent lithographic response difference for different process window (PW) conditions, and design variables are tuned to match the response across the process window.

As described above, the cost function can be a lithographic response. In the context of matching/tuning, the cost function can also be a difference in lithographic response between a current lithographic process and a reference lithographic process. In behaviors matching, the cost function can also be a measure of the difference between the TCC of a lithographic projection apparatus to be adjusted (referred to as $TCC_T$, hereafter) and the TCC representing the reference or desired behaviors (referred to as $TCC_R$, hereafter). In one example, $f_p(z_1, z_2, \ldots, z_N)$ is a modulus of the difference between $TCC_T$ and $TCC_R$: $f_p(z_1, z_2, \ldots, z_N) = |TCC_{T,k',k''} - TCC_{R,k',k''}|$, wherein p is any pair of vectors k' and k''. Since k' and k'' can be continuous in values thereof, the cost function of Eq. 1 can be equivalently written in an integral form:

$$CF(z_1, z_2, \ldots, z_N) = \int_p w_p f_p^2(z_1, z_2, \ldots, z_N) dp, \quad (\text{Eq. 1'})$$

wherein the integration is over all possible p. When the cost function of Eq. 1 or Eq. 1' is minimized, the behaviors of the lithographic projection apparatus to be adjusted are best matched to the desired behaviors. Even though we use a (weighted) mean squared error as an example to demonstrate possible and typical form of the cost function, it should be noted that the cost function can take other forms of difference, such as the maximum difference.

Behaviors matching using TCC, which is independent from the design layout, can be followed by optimization using measurements of the resist image, which is dependent on the design layout. Alternatively, the cost function can also include measurement on the resist image and TCC, minimization of which is a hybrid behavior matching and optimization. For example, the cost function can include differences between actual values and intended values of CDs. An exemplary cost function is:

$$CF(z_1, z_2, \ldots, z_N) = \sum_i w_{CD,i}(\Delta CD_i)^2 + \sum_{p=1}^{P} w_p |TCC_{T,k',k''} - TCC_{R,k',k''}|^2, \quad \text{(Eq. 1'')}$$

wherein $w_{CD,i}$ is a weight constant of the i-th CD on the resist image and $\Delta CD_i$ is the difference between actual values and intended values of the i-th CD. More details of the hybrid behavior matching and optimization can be found in commonly assigned U.S. patent application Ser. No. 12/613,285, published on Jun. 10, 2010 as U.S. Patent Application Publication 2010/0146475, which is incorporated by reference in its entirety. The gauges used in hybrid matching/tuning can be selected using methods described in commonly assigned U.S. patent application Ser. No. 12/613,244, published on May 13, 2010 as U.S. patent application Publication 2010/0122225, which is incorporated by reference in its entirety.

The design variables can be any adjustable parameters such as adjustable parameters of the source, the mask, the projection optics, dose, focus, etc. Preferably, at least some of the design variables are adjustable characteristics of the projection optics. The projection optics may include components collectively called as "wavefront manipulator" that can be used to adjust shapes of a wavefront and intensity distribution and/or phase shift of the irradiation beam. The projection optics preferably can adjust a wavefront and intensity distribution at any location along an optical path of the lithographic projection apparatus, such as before the mask, near a pupil plane, near an image plane, near a focal plane. The projection optics can be used to correct or compensate for certain distortions (or aberrations) of the wavefront and intensity distribution caused by, for example, the source, the mask, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. In matching/tuning, usually the design parameters of the reference lithographic apparatus (physical or virtual) are kept constant, while the design variables of the current lithographic apparatus (physical or virtual) are tuned.

It should be noted that the normal weighted root mean square (RMS) of $f_p(z_1, z_2, \ldots, z_N)$ is defined as $$\sqrt{\frac{1}{P}\sum_{p=1}^{P} w_p \cdot f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

The design variables may have constraints, which can be expressed as $(z_1, z_2, \ldots, z_N) \in Z$, where Z is a set of possible values of the design variables.

The optimization process therefore may be used to find a set of values of the design variables, under the constraints $(z_1, z_2, \ldots, z_N) \in Z$, that minimize the cost function, i.e., to find $$(\tilde{z}_1, \tilde{z}_2, \ldots \tilde{z}_N) = \underset{(z_1,z_2,\ldots,z_N)\in Z}{\text{argmin}} CF(z_1, z_2, \ldots, z_N) = \quad \text{(Eq. 2)}$$
$$\underset{(z_1,z_2,\ldots,z_N)\in Z}{\text{argmin}} \sum_{p=1}^{P} w_p f_p^2(z_1, z_2, \ldots, z_N),$$

or equivalently in an integral form of $$(\tilde{z}_1, \tilde{z}_2, \ldots \tilde{z}_N) = \underset{(z_1,z_2,\ldots,z_N)\in Z}{\text{argmin}} CF(z_1, z_2, \ldots, z_N) = \quad \text{(Eq. 2')}$$
$$\underset{(z_1,z_2,\ldots,z_N)\in Z}{\text{argmin}} \int_p w_p f_p^2(z_1, z_2, \ldots, z_N) dp.$$

In a practical lithographic projection apparatus, the number of the design variables can be in the range of hundreds. The $TCC_{T,k',k''}$, however, is a four-dimensional tensor of continuous variables k' and k''. For computation of $TCC_{T,k',k''}$ using a computer, the $TCC_{T,k',k''}$ is usually discretized into millions or more discrete elements, in order to sufficiently conform to the $TCC_{T,k',k''}$ before discretization. The high ratio of $TCC_{T,k',k''}$ elements to the design variables renders minimization of the cost function to a practically useful degree difficult. In a practical lithographic projection apparatus, however, the number of $TCC_{T,k',k''}$ elements can be significantly reduced because the mask function M(k) of a typical design layout can be decomposed into a sum of products of two one-dimensional functions:

$$M(k) = \sum_i M_{X,i}(k_x) M_{Y,i}(k_y)$$

wherein the vector $k=(k_x, k_y)$. More details can be found in commonly assigned U.S. patent application Ser. No. 12/613,285, published on Jun. 10, 2010 as U.S. Patent Application Publication 2010/0146475, which is incorporated by reference in its entirety. Specifically, only $TCC_{T,k',k''}$ elements in the forms of $TCC_{T,(k_x',0),(k_x'',0)}$ and $TCC_{T,(0,k_y'),(0,k_y'')}$ have non-negligible contribution in the Aerial Image (AI), and thus need to be computed. Note that k' and k'' are vectors and the components of k' and k'' are respectively $(k_x', k_y')$ and $(k_x'', k_y'')$.

The weight constants $w_p$ can have any suitable value. Note that p is any pair of vectors k' and k''. For example, $w_p$ can be greater for $TCC_{T,(k_x',0),(k_x'',0)}$ and $TCC_{T,(0,k_y'),(0,k_y'')}$. In one example, $$w_p(k_x', k_y', k_x'', k_y'') = \begin{cases} 1, & (k_x' = k_x'' = 0) \\ 1, & (k_y' = k_y'' = 0) \\ 0, & \text{otherwise.} \end{cases}$$

In another example $$w_p(k'_x, k'_y, k''_x, k''_y) = \begin{cases} W > 1, & (k'_x = k''_x = k'_y = k''_y = 0) \\ 1, & (k'_y = k''_y = 0, k'_x = k''_x \neq 0) \\ 1, & (k'_x = k''_x = 0, k'_y = k''_y \neq 0) \\ C \ll 1, & \text{otherwise,} \end{cases}$$

wherein W and C are positive constants, such as 15 and 0.01, respectively. Persons skilled in the art will understand that the example specific numerical values are not limiting the scope of the invention.

Figure 4A:
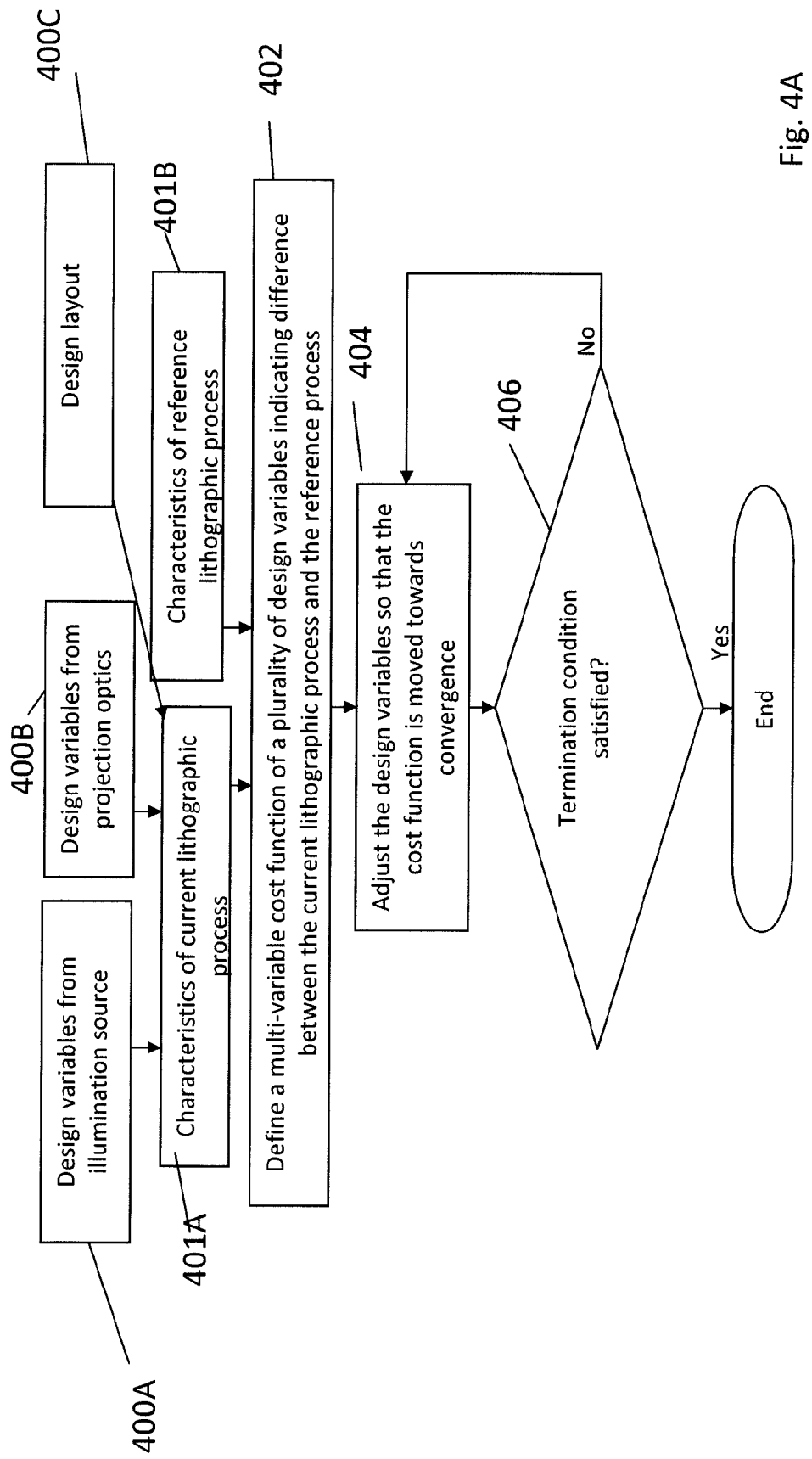
FIG. 4A-4B are a flow diagrams illustrating aspects of example methodologies of matching behaviors of a lithographic projection apparatus according to embodiments.

FIG. 4A shows a flow chart of the method of matching behaviors as described above. The design variables 400B are characteristics of the projection optics. Some of the design variables 400A can be characteristics of the illumination source. Characteristics of the mask design layout are identified in step 400C. If the cost function is only a function of $TCC_T$ and $TCC_R$, no design variables are characteristics of the design layout. Rather, design layout characteristics are represented by constant values. The to-be-tuned characteristics of the current lithographic process in step 401A is a function of at least some of the design variables mentioned above. In step 401B, characteristics of a reference lithographic process is provided. In step 402, a cost function is defined as a function of difference between the to-be-tuned lithographic process and the reference lithographic process. An example of such a cost function is given in Appendix A (equation 4) submitted with provisional application No. 61/414,787, which is incorporated herein by reference in its entirety. Since the TCC difference is a function of the design variables, the cost function is thus a function of the design variables. In step 404, the design variables are adjusted (simultaneously or alternatively) so that the cost function is moved towards convergence. In step 406, it is determined whether a predefined termination condition is satisfied, as defined in step 306 in FIG. 3. An additional termination condition in case of matching/tuning process flow is when a satisfactory matching with a reference scanner behavior is obtained, as further discussed with h reference to FIGS. 4B and 7. If either of the conditions in step 406 is satisfied, the method ends. If none of the conditions in step 406 is satisfied, the steps 404 and 406 are repeated until a desired result is obtained.

Figure 4B:
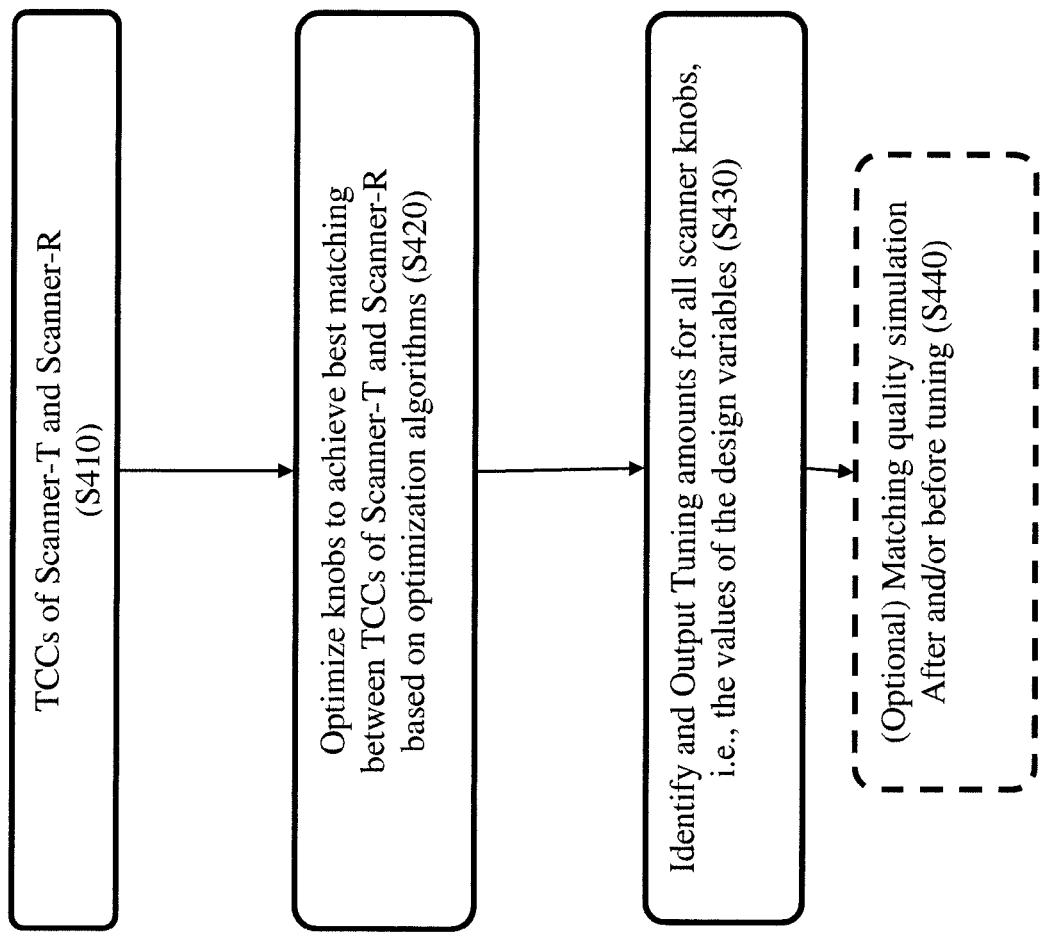

FIG. 4B shows key steps of a optimization-based matching/tuning process where the cost function used for optimization is based on TCCs of scanner-T and Scanner-R. TCCs of Scanner-R and Scanner-T are obtained in step S410. In step S420, the design variables or "knobs" are adjusted to achieve the best matching between the TCCs of Scanner-R and Scanner-T. The optimization may be done with or without constraints. In step S430, the optimal tuning amounts for the scanner knobs, i.e., the optimal values for the design variables, are identified and outputted. The output can be in the form of a projection wave front image (also called aberration map) and/or a illumination source map, or other forms. Optionally, in step S440, matching quality may be simulated to see the improvement after tuning as compared to the matching before tuning.

As discussed before, optimization of the cost function (CF) is at the center of the pattern matching/tuning, and the cost function can represent resist image or any other characteristics.

Figure 5:
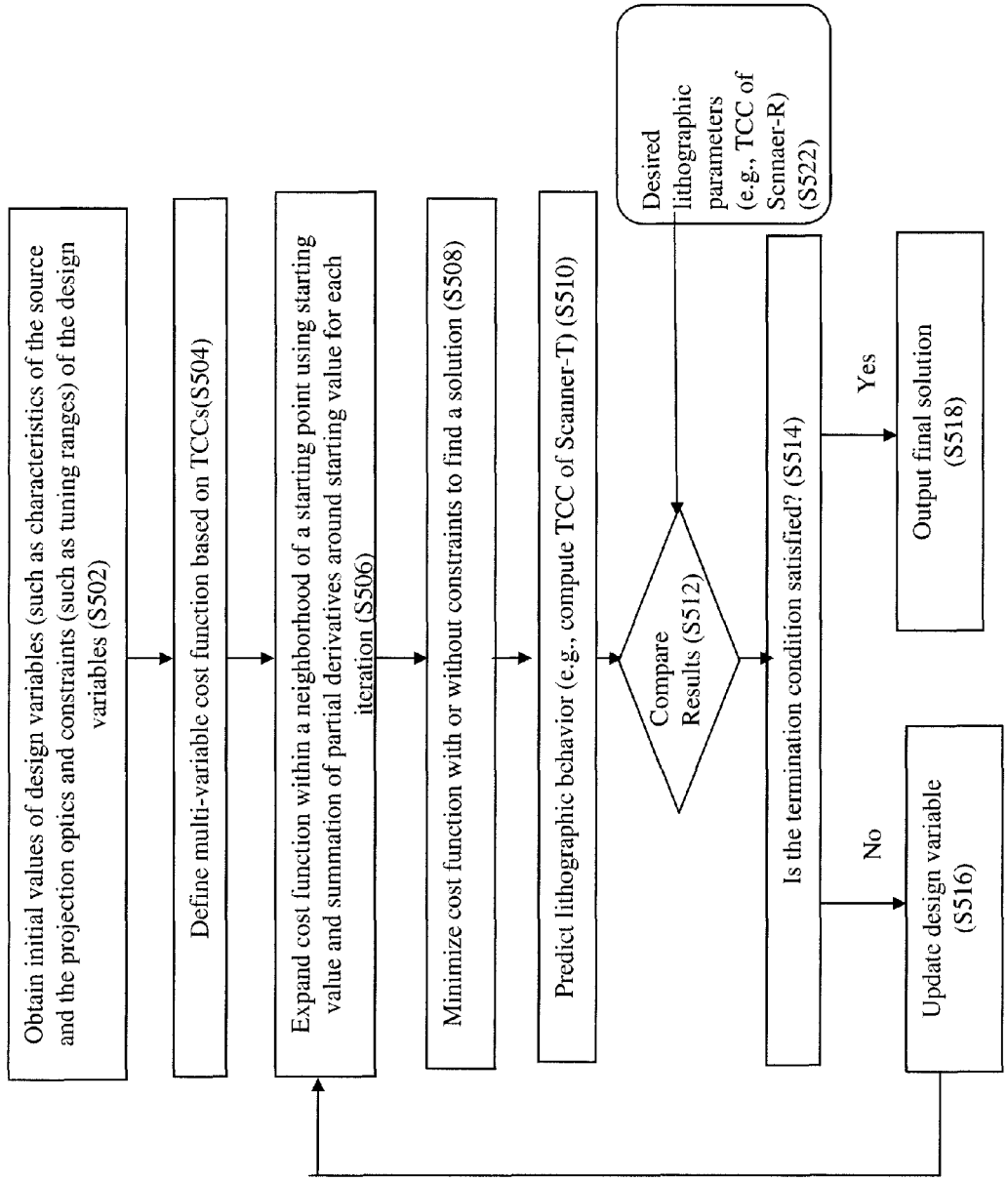
FIGS. 5-6 show example flow diagrams of various optimization processes, according to embodiments of the present invention.

FIG. 5 shows one exemplary method of pattern-matching/tuning using SMLO, where a cost function is minimized. In step 502, initial values of design variables are obtained, including their tuning ranges, if any. In step S504, the multi-variable cost function is set up. The cost function may be based on TCCs. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. In step S510, a lithographic behavior, such as the TCC of Scanner-T is predicted. In step S512, the result of step S510 is compared with desired lithographic parameters, such as, the TCC of Scanner-R, obtained in step S522. If the termination condition is satisfied in step S514, i.e. the optimization generates a lithographic response value sufficiently close to the desired value or the optimization process has converged such that the cost function does not decrease any more or a preset maximum number of iterations (or maximum time limit) is hit, then the final value of the design variables is outputted in step S518. Various termination condition examples are discussed with respect to FIGS. 3 and 4. The output step may also include outputting other functions using the final values of the design variables, such as outputting a wavefront aberration-adjusted map at the pupil plane (or other planes) an optimized source map, etc. If the termination condition is not satisfied, then in step S516, the values of the design variables are updated with the result of the i-th iteration, and the process goes back to step S506. The entire mathematical process of FIG. 5 is elaborated in co-owned provisional application titled, "Optimization of source, mask, and projection optics," (application No. 61/472,372), filed on Nov. 10, 2010.

Figure 6:
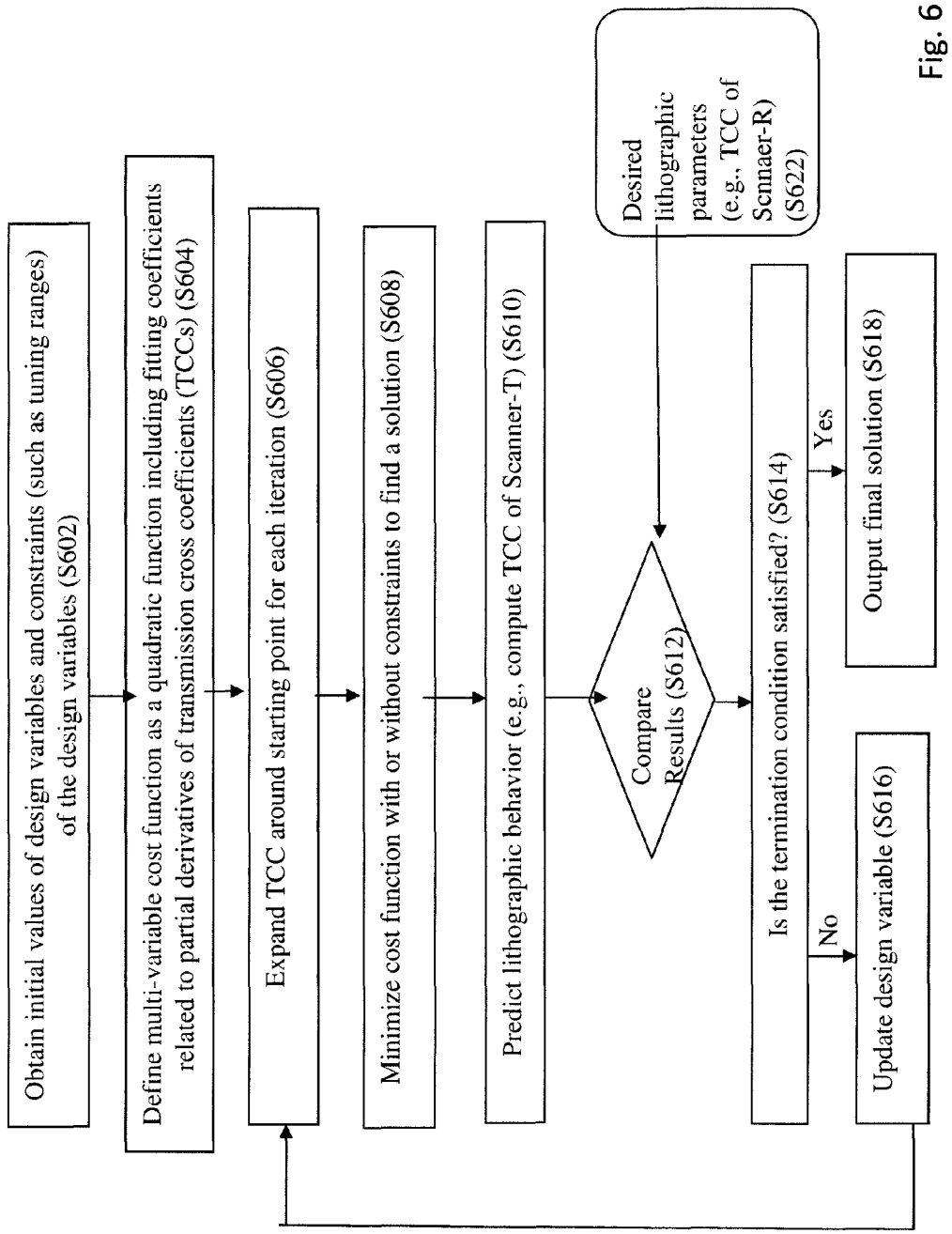

The linear approximation used in step S506 only holds in a small vicinity of $(z_{1i}, z_{2i}, \ldots, z_{Ni})$ in the i-th iteration. If $f_p(z_1, z_2, \ldots, z_N)$ is highly non-linear to the design variables $(z_1, z_2, \ldots, z_N)$, optimization using the linear approximation may take too many iterations and/or lead to a local minimum of the cost function $CF(z_1, z_2, \ldots, z_N)$ instead of a global minimum. This problem can be alleviated by expanding the cost function $CF(z_1, z_2, \ldots, z_N)$ into higher-order-polynomials of some design variables, especially those to which the cost function is highly non-linear, such as cost functions involving aberrations introduced by the projection optics. FIG. 6 shows an example flow diagram illustrating key steps of another matching/tuning process using higher-order-polynomial expansion of the TCCs with respect to design variables. Many of the steps of FIG. 6 are very similar to corresponding steps in FIG. 5, unless explained otherwise here. One major difference is that in step S604, the multi-variable cost function is expressed as a higher-order (such as quadratic) polynomial including fitting coefficients related to, for example, partial derivatives of transmission cross coefficients (TCCs). In step S606 TCC is expanded around starting point for each iteration. In an optional additional step, aerial image, resist image and edge placement error (EPE) may be expanded, but in the specific example of FIG. 6, only TCC expansion is considered for pattern-independent matching/tuning. In step 608, the cost function is minimized using general optimization algorithm to find a solution. This can be done with or without constraints. In step 610, lithographic behavior of the current lithographic apparatus/process is predicted. For example, TCC of scanner-T may be computed. In step S622, desired reference lithographic parameters (such as TCC of Scanner-R) are obtained for comparison with the prediction. The rest of the steps are similar to the corresponding steps described in FIG. 5. From the elucidation above it will be apparent to the skilled person that in a specific embodiment of the invention, the number of iterations may even be one, resulting in a single calculation sequence. This may, for example, occur when the description of some design variables initially is sufficient enough that the predefined termination condition is satisfied after the single calculation. The entire mathematical process of FIG. 6 is elaborated in co-owned application No. 61/472, 372, filed on Nov. 10, 2010.

Figure 7:
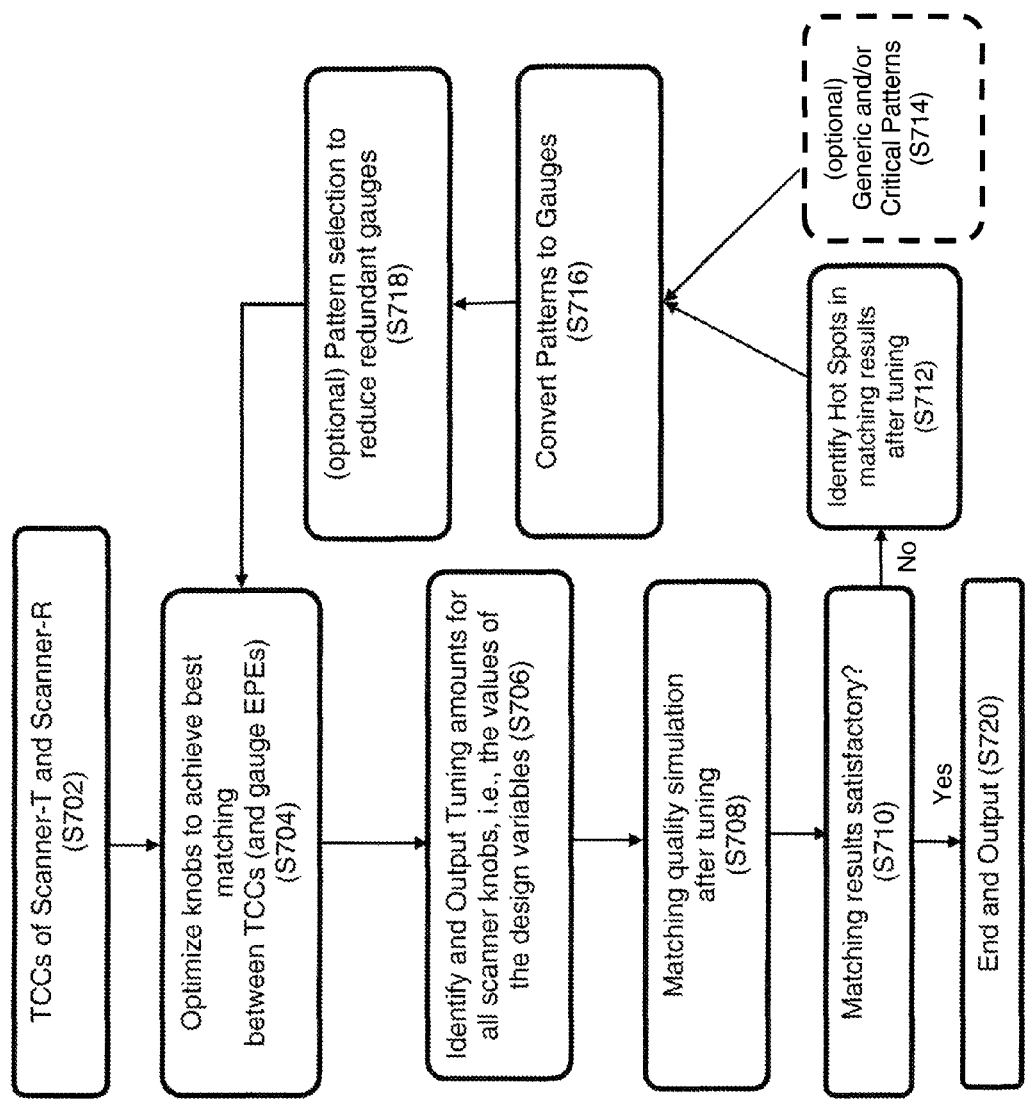
FIG. 7 shows a hybrid matching/tuning flow diagram according to an embodiment of the present invention.

FIG. 7 shows a flow diagram where the appropriate steps from the optimization processes discussed in FIG. 5 or 6 are integrated with the pattern-dependent matching/tuning to form a framework of hybrid scanner matching/tuning. In hybrid matching/tuning, it is possible to add lithographic responses (e.g., CDs or EPEs) of test patterns or gauges on top of pattern-independent TCC matching. In step S702, models of scanner-T and scanner-R are obtained, which include the corresponding TCCs. In step S704, appropriate optimization steps from FIG. 5 or 6 are used to achieve best matching between TCCS and/or other lithographic responses. In step S706, the optimal tuning amounts for all the scanner knobs, i.e., the optimal values for the design variables, are identified and outputted, which can be in the form of a projection wavefront image and/or a illumination source map, or any other form. In step S708, matching quality is simulated after tuning. In step S710 it is determined if the matching results are satisfactory. If yes, then the process ends in step S720. The output of the step S720 may be design variables that produce the best matching of the behavior of scanner-T with that of scanner-R. If not, then hot spots, which are patterns with difference between the two scanners larger than a preset limit, and/or warm spots, which are patterns with difference between the two scanners close to the preset limit for hot spots, are identified in step S712 from the after-tuning matching results of step S708. In step S716, the patterns with identified hot spots and/or warm spots are converted to gauges or test patterns, and the gauge set is updated with the new gauges. The gauge set of S716 may also have generic patterns, critical patterns, or dense patterns, preselected by a customer or the lithography designer based on previous experience (step S714). An optional pattern selection algorithm may be performed (step S718) to reduce the number of redundant gauges. Pattern selection may be done using diffraction signature analysis, or other mathematical techniques. An example of pattern selection algorithm is disclosed in co-pending co-owned application published US 2010/0122225. The method of matching behaviors using SMLO is repeated in step S704 with the new set of gauges using the process of FIG. 5 or FIG. 6, as applicable. The new gauges may be, for example, a set of gauges that produce resist image (or other lithographic responses such as CD, EPE, and etc) with measurement values sufficiently different from the previous measurement values (e.g., the difference is bigger than a preset limit). The design variables (i.e. turning knobs) are optimized to simulate the behavior of the scanner-T or the differential behavior with respect to scanner-R. The steps S704-S718 are repeated until a satisfactory matching is obtained. Satisfactory matching with a reference behavior is used as an additional termination condition (on top of the termination conditions described in FIG. 3) in FIG. 7.

Persons skilled in the art will appreciate that models of Scanner-T and Scanner-R do not have to have the exact same design variables. This may translate to mean that a different type of physical scanner or a virtual scanner may be used as reference when tuning a specific type of Scanner-T. Moreover, Scanner-R design variables (or characteristics) may be kept constant, while only the design variables of Scanner-T are tuned.

Figure 8:
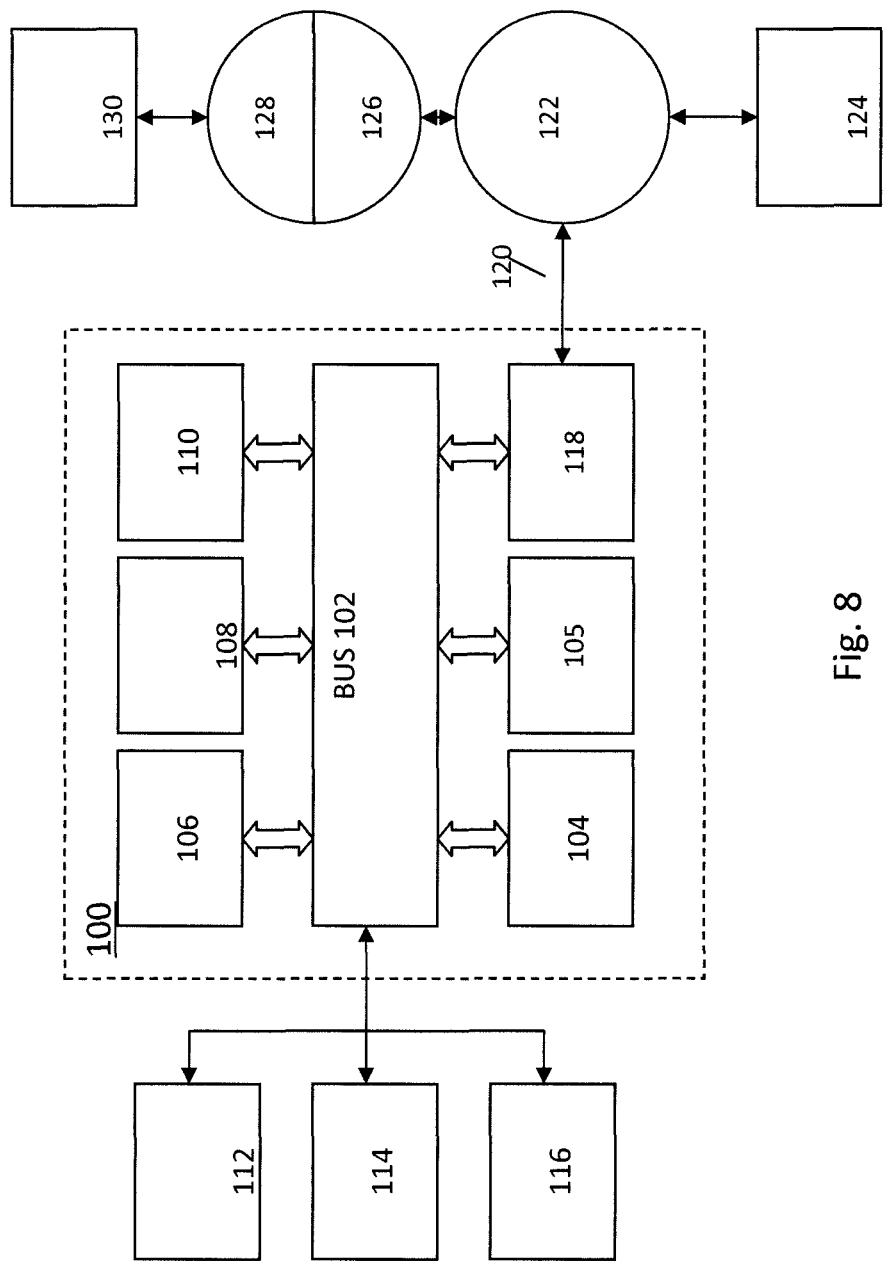
FIG. 8 is a block diagram of an example computer system in which embodiments can be implemented.

FIG. 8 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 9:
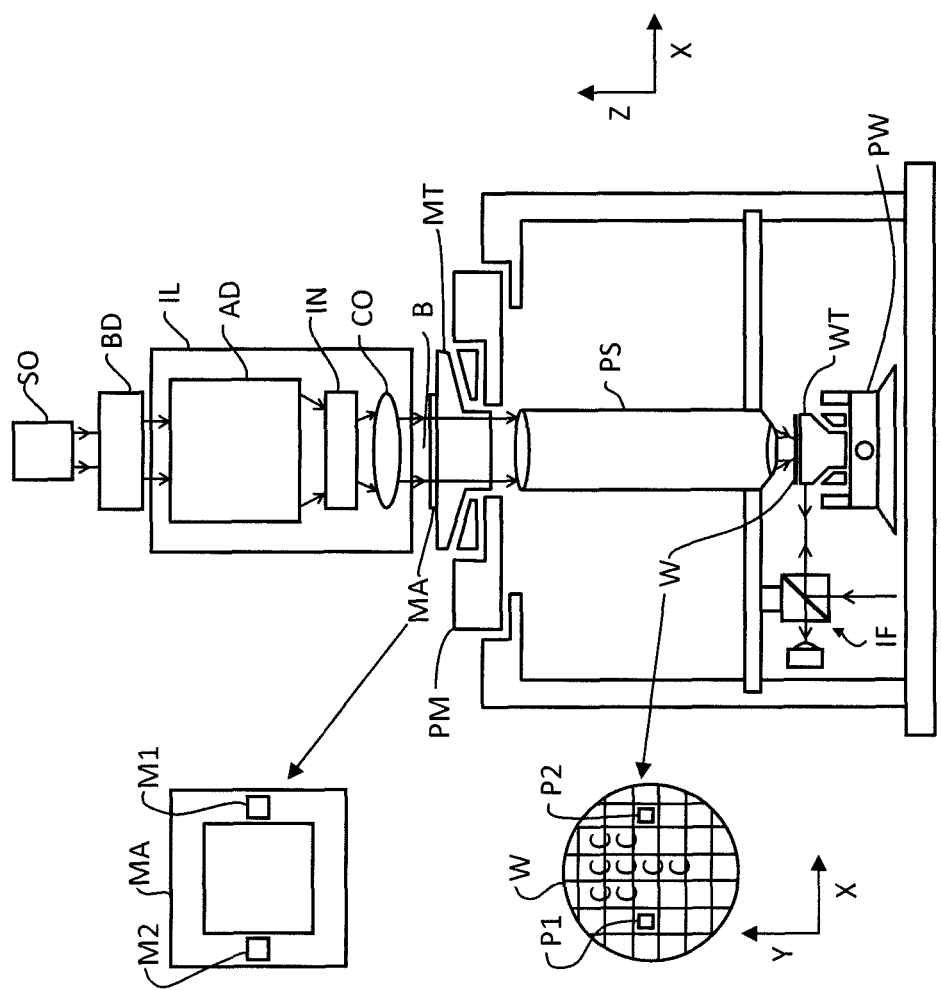
FIG. 9 is a schematic diagram of a lithographic projection apparatus to which embodiments are applicable.

FIG. 9 schematically depicts an exemplary lithographic projection apparatus whose illumination source could be optimized utilizing the methods described herein. The apparatus comprises:

a radiation system IL, for supplying a projection beam B of radiation. In this particular case, the radiation system also comprises a radiation source SO;

a first object table (mask table) MT provided with a mask holder for holding a mask MA (e.g., a reticle), and connected to first positioning means for accurately positioning the mask with respect to item PS;

a second object table (substrate table) WT provided with a substrate holder for holding a substrate W (e.g., a resist-coated silicon wafer), and connected to second positioning means for accurately positioning the substrate with respect to item PS;

a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross-section.

It should be noted with regard to FIG. 9 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the mask MA, which is held on a mask table MT. Having traversed the mask MA, the beam B passes through the lens PS, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 9. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;

In scan mode, essentially the same scenario applies, except that a given target portion C is not exposed in a single "flash".

Instead, the mask table MT is movable in a given direction (the so-called "scan direction", e.g., the y direction) with a speed v, so that the projection beam B is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

The invention may further be described using the following clauses:

1. A computer-implemented method for tuning a lithographic process to a reference lithographic process, the lithographic process being configured for imaging a portion of a design layout onto a substrate using a lithographic projection apparatus comprising an illumination source and projection optics, the method comprising:
defining a multi-variable cost function of a plurality of design variables that represent characteristics of the lithographic process, wherein the cost function comprises a difference in optical characteristics of the lithographic projection apparatus between the lithographic process and the reference lithographic process and wherein at least some of the design variables comprise characteristics of the projection optics; and
reconfiguring the characteristics of the lithographic process by adjusting the design variables until a predefined termination condition is satisfied.
2. The method of clause 1, wherein the difference in optical characteristics of the lithographic projection apparatus comprises a difference in the optical characteristics of the illumination source and/or the projection optics.
3. The method of clause 1, wherein the cost function further comprises difference in lithographic response between the lithographic process and the reference lithographic process.
4. The method of clause 1, 2, or 3, wherein the cost function is minimized by solving polynomials, including higher-order polynomials of the design variables.
5. The method of clause 4, wherein the cost function is expanded in terms of fitting constant coefficients.
6. The method of clause 5, wherein the fitting constant coefficients are computed from coefficients from polynomial expansion of transmission cross coefficients (TCCs).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made to the embodiments as described without departing from the scope of the claims set out below.

What is claimed is:

1. A computer-implemented method comprising:
obtaining model coefficients representing optical behavior of a lithographic process for imaging a portion of a design layout onto a substrate using a lithographic projection apparatus comprising an illumination source and projection optics;
obtaining model coefficients representing optical behavior of a reference lithographic process separate from the lithographic process to which the lithographic process is to be tuned, wherein tuning comprises matching the optical behavior of the lithographic process to the reference lithographic process; and
tuning the lithographic process to the reference lithographic process by:
defining a multi-variable cost function of a plurality of design variables that represent adjustable characteristics of the lithographic process, the cost function being defined in terms of a difference between the obtained model coefficients for the lithographic process and the reference lithographic process, wherein at least some of the design variables comprise adjustable characteristics of the projection optics; and
reconfiguring, using a computer, the characteristics of the lithographic process by adjusting the design variables until a predefined termination condition associated with the cost function is satisfied.

2. The method of claim 1, wherein the difference in between the obtained model coefficients comprises a difference in the optical characteristics of the illumination source and/or the projection optics between the lithographic process and the reference lithographic process.

3. The method of claim 1, wherein the cost function further comprises a difference in lithographic response between the lithographic process and the reference lithographic process for a given design layout.

4. The method of claim 1, wherein the reference lithographic process represents one of the following:
optical characteristics of a reference lithographic projection apparatus;
optical characteristics of a virtual reference lithographic projection apparatus in a simulation model to generate a desired lithographic response;
a lithographic response as measured from the portion of the design layout imaged on a reference substrate and/or optical characteristics calibrated from measurements; and
optical characteristics and/or lithographic response from a lithographic projection apparatus that is physically and/or characteristically different from the lithographic projection apparatus being used to tune the lithographic process.

5. The method of claim 1, wherein the portion of the design layout comprises one or more of the following: an entire design layout, a clip, a section of a design layout that is known to have one or more critical features, a section of the design layout where a hot spot or a warm spot has been identified from a full-chip simulation, and a section of the design layout where one or more critical features have been identified by a pattern selection method.

6. The method of claim 1, wherein the predefined termination condition includes one or more of: minimization of the cost function; maximization of the cost function; reaching a preset number of iterations; reaching a value of the cost function equal to or beyond a preset threshold value; reaching a predefined computation time; and, reaching a value of the cost function within an acceptable error limit.

7. The method of claim 1, wherein the method further comprises:
- using the values of the design variables to update the lithographic process when the predetermined termination condition is satisfied;
- comparing the updated lithographic process with the reference lithographic process; and
- repeating the updating step and the comparing step until an additional termination condition is satisfied.

8. The method of claim 7, wherein the additional termination condition indicates an acceptable matching between the characteristics of the lithographic process and the reference lithographic process.

9. The method of claim 1, wherein the reconfiguration step is performed without constraints or with constraints dictating the range of at least some of the design variables.

10. The method of claim 9, wherein at least some of the design variables are under constraints representing physical restrictions in a hardware implementation of the lithographic projection apparatus.

11. The method of claim 10, wherein the constraints include one or more of: tuning ranges, rules governing mask manufacturability, and interdependence between the design variables.

12. The method of claim 1, wherein the cost function is a function comprising a difference between a transmission cross coefficient (TCC) of the lithographic projection apparatus and a transmission cross coefficient of physical or virtual lithographic projection apparatus used for simulating the reference lithographic process.

13. The method of claim 1, wherein the cost function further comprises a function of a difference of one or more of the following lithographic metrics: edge placement error, critical dimension, resist contour distance, worst defect size, and best focus shift.

14. The method of claim 1, wherein the method comprises, prior to performing the steps of the optimization process, selecting a subset of target patterns that characteristically represents features of the portion of the design layout.

15. The method of claim 14, wherein hot spots or warm spots identified within the portion of the design layout are converted into test patterns and are included in the subset of target patterns that are used for a current optimization process.

16. The method of claim 1, wherein optimization of various design variables are performed simultaneously until the predefined termination condition is satisfied.

17. The method of claim 1, wherein optimization of various design variables are performed alternatively, keeping at least some of the design variables fixed while the other design variables are optimized, and
- repeating the alternative optimization process until the predefined termination condition is satisfied.

18. The method of claim 1, wherein the optimization process includes iteratively minimizing the cost function by calculating linear fitting coefficients within predefined relatively small neighborhoods around a starting point in each iteration.

19. The method of claim 1, wherein the cost function is minimized by solving polynomials, including higher-order polynomials of the design variables.

20. A computer program product comprising a non-transitory computer readable medium having instructions recorded thereon, the instructions when executed by a computer implement the method of claim 1.

* * * * *